(12) United States Patent
Hong et al.

(10) Patent No.: US 11,355,640 B1
(45) Date of Patent: Jun. 7, 2022

(54) HYBRID MULTI-STACK SEMICONDUCTOR DEVICE INCLUDING SELF-ALIGNED CHANNEL STRUCTURE AND METHOD OF MANUFACTURING THE SAME

(71) Applicant: SAMSUNG ELECTRONICS CO., LTD., Suwon-si (KR)

(72) Inventors: Byounghak Hong, Albany, NY (US); Seunghyun Song, Albany, NY (US)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 17/167,640

(22) Filed: Feb. 4, 2021

Related U.S. Application Data

(60) Provisional application No. 63/114,114, filed on Nov. 16, 2020.

(51) Int. Cl.

| | |
|---|---|
| *H01L 29/78* | (2006.01) |
| *H01L 27/088* | (2006.01) |
| *H01L 29/423* | (2006.01) |
| *H01L 29/786* | (2006.01) |
| *H01L 29/66* | (2006.01) |
| *H01L 21/8234* | (2006.01) |
| *H01L 29/06* | (2006.01) |

(52) U.S. Cl.
CPC .... *H01L 29/785* (2013.01); *H01L 21/823412* (2013.01); *H01L 21/823431* (2013.01); *H01L 21/823456* (2013.01); *H01L 27/0886* (2013.01); *H01L 29/0665* (2013.01); *H01L 29/42392* (2013.01); *H01L 29/66545* (2013.01); *H01L 29/78696* (2013.01)

(58) Field of Classification Search
CPC ......... H01L 21/8234; H01L 21/823412; H01L 21/823431; H01L 21/823437; H01L 21/82345; H01L 21/823456; H01L 21/8238; H01L 21/823807; H01L 21/823821; H01L 21/823828; H01L 21/823842; H01L 27/0886; H01L 27/0924; H01L 29/0665; H01L 29/0669; H01L 29/0673; H01L 29/42392; H01L 29/66545; H01L 29/785; H01L 29/78645; H01L 29/78696; B82Y 10/00; B82Y 40/00
See application file for complete search history.

(56) References Cited

U.S. PATENT DOCUMENTS

| | | |
|---|---|---|
| 16,256,158 | 4/2019 | Frougier et al. |
| 10,734,224 B2 | 8/2020 | Smith et al. |

(Continued)

*Primary Examiner* — Cheung Lee
(74) *Attorney, Agent, or Firm* — Sughrue Mion, PLLC

(57) ABSTRACT

A hybrid multi-stack semiconductor device and a method of manufacturing the same are provided. The hybrid multi-stack semiconductor device includes a nanosheet stack and a fin field-effect transistor (finFET) stack formed above the nanosheet stack, wherein the nanosheet stack includes a plurality of nanosheet layers formed above a substrate and enclosed by a $1^{st}$ gate structure, wherein the at least one fin structure has a self-aligned form with respect to the nanosheet stack so that a left horizontal distance between a leftmost side surface of the at least one fin structure and a left side surface of the nanosheet stack is equal to a right horizontal distance between a rightmost side surface of the at least one fin structure and a right side surface of the nanosheet stack.

20 Claims, 16 Drawing Sheets

(56) References Cited

U.S. PATENT DOCUMENTS

| | | |
|---|---|---|
| 2019/0172828 A1 | 6/2019 | Smith et al. |
| 2019/0393214 A1 | 12/2019 | Lilak et al. |
| 2019/0393352 A1 | 12/2019 | Guha et al. |
| 2020/0006331 A1 | 1/2020 | Lilak et al. |
| 2020/0051869 A1 | 2/2020 | Chiang et al. |
| 2020/0119015 A1 | 4/2020 | Bi et al. |
| 2020/0287022 A1 | 9/2020 | Le et al. |
| 2021/0159311 A1* | 5/2021 | Lan ..................... H01L 29/775 |
| 2022/0013521 A1 | 1/2022 | Zhang et al. |

* cited by examiner

HYBRID MULTI-STACK SEMICONDUCTOR DEVICE INCLUDING SELF-ALIGNED CHANNEL STRUCTURE AND METHOD OF MANUFACTURING THE SAME

CROSS-REFERENCE TO THE RELATED APPLICATION

This application is based on and claims priority from U.S. Provisional Application No. 63/114,114 filed Nov. 16, 2020 in the U.S. Patent and Trademark Office, the disclosure of which is incorporated herein in its entirety by reference.

BACKGROUND

1. Field

Apparatuses and methods consistent with example embodiments of the disclosure relate to a channel structure of a semiconductor device, and more particularly to, a self-aligned channel structure of a gate all around transistor such as a fin field-effect transistor (finFET) or a nanosheet.

2. Description of the Related Art

The increased density of integrated circuit (IC) elements in an electronic device has been made good due to implementation of smaller size of transistors with an improved performance. The conventional planar field-effect transistor (FET) has evolved into gate all around transistor structures such as a finFET and a nanosheet transistors, which may also be referred to as a multi-bridge channel field effect transistor (MBCFET), in an effort to concentrate more transistors in a unit area of a semiconductor device.

Recently, research has been focused on how to build finFETs and the nanosheet transistors in a three-dimensional (3D) structure to further increase density of the transistor structures.

Information disclosed in this Background section has already been known to the inventors before achieving the embodiments of the present application or is technical information acquired in the process of achieving the embodiments. Therefore, it may contain information that does not form the prior art that is already known to the public.

SUMMARY

The disclosure provides hybrid multi-stack semiconductor devices having a self-aligned nanosheet stack and/or self-aligned fin structures of a finFET stack.

According to an embodiment, there is provided a hybrid multi-stack semiconductor device including a nanosheet stack and a finFET stack formed above the nanosheet stack, wherein the nanosheet stack includes a plurality of nanosheet layers formed above a substrate and enclosed by a $1^{st}$ gate structure, wherein the finFET stack includes at least one fin structure enclosed by a $2^{nd}$ gate structure, and wherein the at least one fin structure may have a self-aligned form with respect to the nanosheet stack so that a left horizontal distance between a leftmost side surface of the at least one fin structure and a left side surface of the nanosheet stack is equal to a right horizontal distance between a rightmost side surface of the at least one fin structure and a right side surface of the nanosheet stack.

According to an embodiment, there is provided a hybrid multi-stack semiconductor device including a nanosheet stack and a finFET stack formed above the nanosheet stack, wherein the nanosheet stack includes a plurality of nanosheet layers formed above a substrate and enclosed by a $1^{st}$ gate structure, wherein the finFET stack includes at least one fin structure enclosed by a $2^{nd}$ gate structure, and wherein the nanosheet stack may have a self-aligned form with respect to the $2^{nd}$ gate structure so that the plurality of nanosheet layers have a same width as the $2^{nd}$ gate structure in a channel width direction.

According to an embodiment, there is provided a method of manufacturing a hybrid multi-stack semiconductor device. The method may include: providing a nanosheet stack including a plurality of sacrificial layers and nanosheet layers alternatingly formed above a substrate, and a finFET stack formed above the nanosheet stack; forming an interlayer dielectric (ILD) layer contacting side surfaces of the finFET stack and side surfaces of the nanosheet stack; removing an upper portion of the finFET stack to form a preliminary fin structure, which is a height-reduced finFET stack, and a recess on the preliminary fin structure and between the ILD layer, and adding a spacer layer having a predetermined thickness on inner side surfaces of the ILD layer exposed to the recess so that a width of the recess is reduced; forming at least one mask layer on the preliminary fin structure in the width-reduced recess so that the at least one mask layer contacts inner side surfaces the spacer layer exposed to the width-reduced recess; removing the ILD layer and the spacer layer, wherein a left horizontal distance between a leftmost side surface of the at least one mask layer and a left side surface of the nanosheet stack is equal to a right horizontal distance between a rightmost side surface of the at least one mask layer and a right side surface of the nanosheet stack.

According to an embodiment, there is provided a method of manufacturing a hybrid multi-stack semiconductor device. The method may include: providing a nanosheet stack including a plurality of sacrificial layers and nanosheet layers alternatingly formed above a substrate; forming at least one channel structure above the nanosheet stack; depositing a gate masking layer on the at least channel structure to form a finFET stack such that the gate masking layer is formed on top and side surfaces of the at least one channel structure and spread outward above the nanosheet stack to form outer-extended portions of the gate masking layer, wherein the gate masking layer at both sides of the at least one channel structure has a same width in a channel width direction; removing the outer-extended portions of the gate masking layer; and etching the nanosheet stack below the outer-extended portions of the gate masking layers so that side surfaces of the nanosheet stack are coplanar with side surfaces of the finFET stack.

The above embodiment may provide hybrid multi-stack semiconductor devices having stable and balanced fin structures of a finFET stack formed above a nanosheet stack, and further, nanosheet layers of the nanosheet stack of which a width is controlled by the dimensions of the fin structures of the finFET stack such as the number of the fin structures and/or the pitch between the fin structures.

BRIEF DESCRIPTION OF THE DRAWINGS

Example embodiments of the inventive concept will be more clearly understood from the following detailed description taken in conjunction with the accompanying drawings in which.

DETAILED DESCRIPTION OF THE EMBODIMENTS

Figure 1:
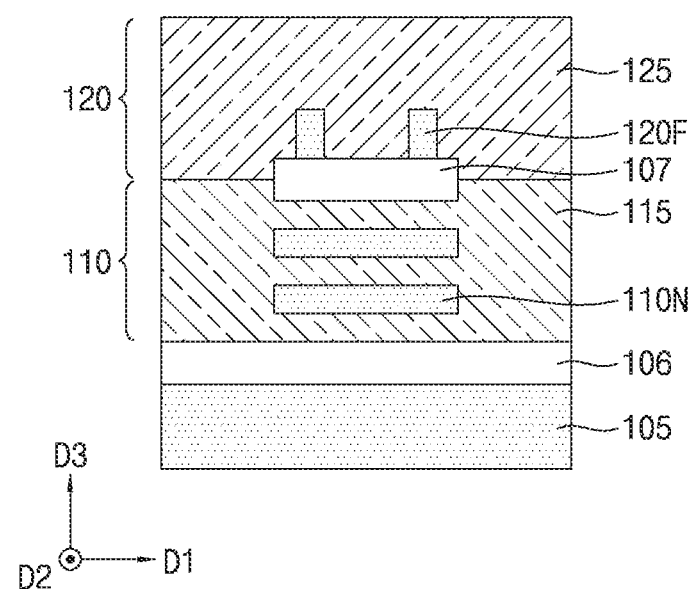
FIG. 1 illustrates a simplified cross-sectional view of a hybrid multi-stack semiconductor device according to an embodiment.

The embodiments described herein are all example embodiments, and thus, the inventive concept is not limited thereto, and may be realized in various other forms. Each of the embodiments provided in the following description is not excluded from being associated with one or more features of another example or another embodiment also provided herein or not provided herein but consistent with the inventive concept. For example, even if matters described in a specific example or embodiment are not described in a different example or embodiment thereto, the matters may be understood as being related to or combined with the different example or embodiment, unless otherwise mentioned in descriptions thereof. In addition, it should be understood that all descriptions of principles, aspects, examples, and embodiments of the inventive concept are intended to encompass structural and functional equivalents thereof. In addition, these equivalents should be understood as including not only currently well-known equivalents but also equivalents to be developed in the future, that is, all devices invented to perform the same functions regardless of the structures thereof. For example, a MOSFET described herein may take a different type or form of a transistor as long as the inventive concept can be applied thereto.

It will be understood that when an element, component, layer, pattern, structure, region, or so on (hereinafter collectively "element") of a semiconductor device is referred to as being "over," "above," "on," "below," "under," "beneath," "connected to" or "coupled to" another element the semiconductor device, it can be directly over, above, on, below, under, beneath, connected or coupled to the other element or an intervening element(s) may be present. In contrast, when an element of a semiconductor device is referred to as being "directly over," "directly above," "directly on," "directly below," "directly under," "directly beneath," "directly connected to" or "directly coupled to" another element of the semiconductor device, there are no intervening elements present. Like numerals refer to like elements throughout this disclosure.

Spatially relative terms, such as "over," "above," "on," "upper," "below," "under," "beneath," "lower," and the like, may be used herein for ease of description to describe one element's relationship to another element(s) as illustrated in the figures. It will be understood that the spatially relative terms are intended to encompass different orientations of a semiconductor device in use or operation in addition to the orientation depicted in the figures. For example, if the semiconductor device in the figures is turned over, elements described as "below" or "beneath" other elements would then be oriented "above" the other elements. Thus, the term "below" can encompass both an orientation of above and below. The semiconductor device may be otherwise oriented (rotated 90 degrees or at other orientations) and the spatially relative descriptors used herein interpreted accordingly. In addition, terms such as a "row" and a "column" of an array, in which a plurality of semiconductor structures are arranged, may be interpreted as a "column" and a "row" when the array is rotated 90 degrees.

As used herein, expressions such as "at least one of," when preceding a list of elements, modify the entire list of elements and do not modify the individual elements of the list. For example, the expression, "at least one of a, b, and c," should be understood as including only a, only b, only c, both a and b, both a and c, both b and c, or all of a, b, and c. Herein, when a term "same" is used to compare a dimension of two or more elements, the term may cover a "substantially same" dimension.

It will be understood that, although the terms first, second, third, fourth etc. may be used herein to describe various elements, these elements should not be limited by these terms. These terms are only used to distinguish one element from another element. Thus, a first element discussed below could be termed a second element without departing from the teachings of the inventive concept.

It will be also understood that, when a plurality of layers or films (collectively "layers") including a substrate are seen in the drawings or described as sequentially formed, any one among the layers formed below another of the layers may have been formed after the other layer is formed unless the layer is described or indicated as being formed prior to the other layer.

It will be further understood that, although in an embodiment of manufacturing an inventive apparatus or structure, a step or operation is described later than another step or operation, the step or operation may be performed later than the other step or operation unless the other step or operation is described as being performed after the step or operation.

Many embodiments are described herein with reference to cross-sectional illustrations that are schematic illustrations of the embodiments (and intermediate structures). As such, variations from the shapes of the illustrations as a result, for example, of manufacturing techniques and/or tolerances, are to be expected. Thus, the embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the present inventive concept. Further, in the drawings, the sizes and relative sizes of layers and regions may be exaggerated for clarity.

For the sake of brevity, conventional elements to semiconductor devices including a finFET and a nanosheet transistor may or may not be described in detail herein. However, even if a certain element is described or illustrated in a semiconductor device in this disclosure, the element may not be included in a claimed semiconductor device unless the element is recited as being included in the claimed semiconductor device. Also, when a particular method for deposition or etching used in manufacturing a semiconductor device is or is not mentioned herein, it will be understood that a conventional method for such deposition or etching may be applied in corresponding steps of manufacturing the semiconductor device.

FIG. 1 illustrates a simplified cross-sectional view of a hybrid multi-stack semiconductor device according to an embodiment.

Referring to FIG. 1, a hybrid multi-stack semiconductor device 100 includes a substrate 105 and a plurality of semiconductor layers sequentially stacked thereon. The plurality of layers includes a shallow trench isolation (STI) layer 106, a nanosheet stack 110, an isolation layer 107, and a finFET stack 120 in this order. Here, the nanosheet stack 110 and the finFET stack 120 may form a nanosheet transistor and a finFET, respectively.

The substrate 105 may be formed of silicon (Si) or other semiconductor materials, such as germanium (Ge), or may be a silicon-on-insulator (SOI) substrate. The STI layer 106 is provided to isolate the nanosheet stack 110 from the substrate 105, and may be formed of, for example, silicon oxide ($SiO_x$). The isolation layer 107 is provided to isolate the finFET stack 120 from the nanosheet stack 110, and may be formed of a material the same as or different from the material forming the STI layer 106.

The nanosheet stack 110 includes a plurality of nanosheet layers 110N enclosed by a $1^{st}$ gate structure 115, and the finFET stack 120 includes a plurality of fin structures 120F enclosed by a $2^{nd}$ gate structure 125 and the isolation layer 107. While bottom surfaces of the fin structures 120F are not covered by the $2^{nd}$ gate structure 125, all of top, bottom and side surfaces of the nanosheet layers 110N may be covered by the $1^{st}$ gate structure 115.

The nanosheet layers 110N are provided as a channel for current flow in the nanosheet transistor to be obtained from the nanosheet stack 110, and the fin structures 120F are provided as a channel for current flow in the finFET to be obtained from the finFET stack 120. According to an embodiment, the nanosheet stack 110 may constitute an n-type metal oxide semiconductor field-effect transistor (NMOS) when source/drain regions (not shown) are formed on both ends of the nanosheet layers 110N open from the $1^{st}$ gate structure in a D2 direction, and the finFET stack 120 may constitute a p-type metal oxide semiconductor field-effect transistor (PMOS) when source/drain regions (not shown) are formed on both ends of the fin structures 120F open from the $2^{nd}$ gate structure 125 in the D2 direction.

Here, the D2 direction is perpendicular to a D1 direction which is a channel width direction, and a D3 direction which is a channel height direction.

A nanosheet transistor as described herein may have a better performance in electron transport, and a finFET may have a better performance in hole transport. Therefore, a nanosheet transistor may be selected as NMOS while a finFET is selected as PMOS in constituting a complementary metal oxide semiconductor (CMOS) device. Further, the $1^{st}$ and $2^{nd}$ gate structures 115 and 125 may be connected to each other for the PMOS and the NMOS to receive a same gate input signal for the CMOS, or they may be separated by an insulator (not shown) and receive different inputs. The nanosheet stack 110 and the finFET stack 120 may respectively constitute a PMOS and an NMOS, or they may both constitute a PMOS or an NMOS, according to various embodiments.

With the above-described 3D structure of the hybrid multi-stack semiconductor device 100, an increased device density may be achieved in manufacturing electronic devices including the hybrid multi-stack semiconductor device.

However, when manufacturing the hybrid multi-stack semiconductor device 100, particularly, in forming the fin structures 120F of the finFET stack 120 on the nanosheet stack 110 through a photolithography masking and etching process, the fin structures 120F may slip away, misalign, or disappear above the nanosheet stack 110 and the isolation layer 108. Therefore, in order to address this possible manufacturing deficiency, the following embodiments of self-aligning fin structures of a finFET stack on a nanosheet stack are provided so that the finFET stack has fin structures positioned at the desired places above the nanosheet stack to build an improved hybrid multi-stack semiconductor device.

FIGS. 2A through 2L illustrates simplified cross-sectional views of a hybrid multi-stack semiconductor device at a plurality of steps during its manufacturing process including self-aligning of a finFET stack with respect to a nanosheet stack formed below the finFET stack, according to embodiments.

Figure 2A:
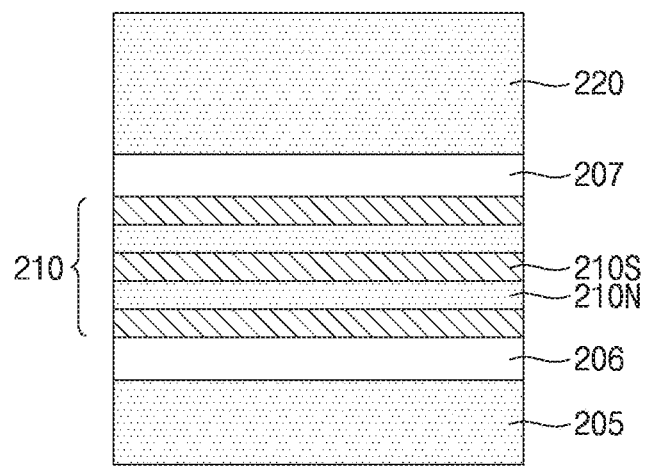
FIGS. 2A through 2L illustrates simplified cross-sectional views of a hybrid multi-stack semiconductor device at a plurality of steps during its manufacturing process including self-aligning of a finFET stack with respect to a nanosheet stack formed below the finFET stack, according to embodiments.

Referring to FIG. 2A, a hybrid multi-stack semiconductor device 200 includes a substrate 205 and a plurality of layers sequentially stacked thereon. The plurality of layers may include an STI layer 206, a nanosheet stack 210, an isolation layer 207, and a finFET stack 220. The substrate 205, the STI layer 206 and the isolation layer 207 may be formed of the same material and for the same purpose as the substrate 105, the STI layer 106 and the isolation layer 107, respectively, shown in FIG. 1, and thus, duplicate descriptions are omitted herein.

The nanosheet stack 210 includes three sacrificial layers 210S and two nanosheet layers 210N alternatingly layered above the STI layer 206. The sacrificial layers 210S may include silicon-germanium (SiGe) while the nanosheet layers 210N includes Si. Each of the sacrificial layers may be SiGe 35%, which indicates that the SiGe compound consists of 35% of Ge and 65% of Si. The sacrificial layers 210S are to be removed along with a dummy gate structure and replaced with a gate structure after source/drain regions are formed on the nanosheet layers 210N to complete the nanosheet stack 210 as a nanosheet transistor in later steps. It is understood here that the numbers of the sacrificial layers 210S and the nanosheet layers 210N are not limited to three and two as shown in FIG. 2A, and more than three sacrificial layers and more than two nanosheet layers may constitute the nanosheet stack 210 according to embodiments.

The finFET stack 220 is to be formed as a channel structure of a finFET in a later step, and may be formed of Si or SOI.

Figure 2B:
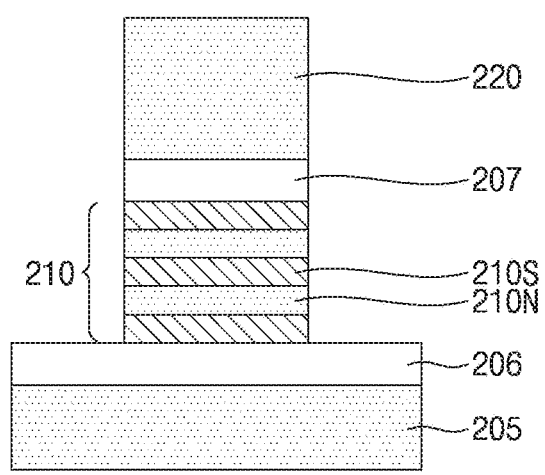

Referring to FIG. 2B, the hybrid multi-stack semiconductor device 200 is etched, for example, by dry etching, at its entire side surfaces above the substrate 205 and the STI layer 206 so that the nanosheet layers 210N and the sacrificial layers 210S have a desired width in a D1 direction for a nanosheet transistor to be obtained from the nanosheet stack 210. By this etching operation, both side surfaces of the finFET stack 220 may become vertically coplanar with both side surfaces of the nanosheet stack 210, respectively.

Figure 2C:
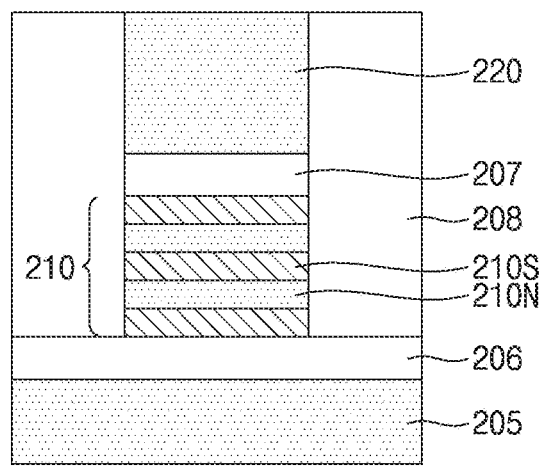

In FIG. 2C, an interlayer dielectric (ILD) layer 208 is deposited in a space obtained from the etching of the hybrid multi-stack semiconductor device 200 (at both its sides) in the previous step. This deposition may be performed through, for example, chemical vapor deposition (CVD), plasma enhanced chemical vapor deposition (PECVD), or atomic layer deposition (ALD). After the deposition of the ILD layer 208, the hybrid multi-stack semiconductor device 200 may be planarized at its top so that a top surface of the finFET stack 220 may become horizontally coplanar with top surfaces of the ILD layer 208 deposited at both sides of the hybrid multi-stack semiconductor device 200 and above the substrate 205.

The ILD layer 208 may be formed of an oxide material in bulk such as silicon dioxide ($SiO_2$) having a low-k dielectric to isolate the hybrid multi-stack semiconductor device 200 from an adjacent hybrid multi-stack semiconductor device during manufacturing these hybrid multi-stack semiconductor devices in their respective cells.

Figure 2D:
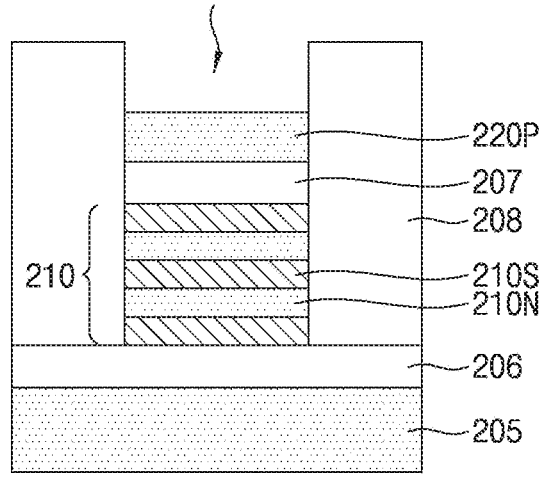

Referring to FIG. 2D, the finFET stack 220 is etched down by dry etching and/or wet etching using the ILD layer 208 as a mask to form a preliminary fin structure 220P, which is a height-reduced finFET stack 220. This etching is performed to the extent that the preliminary fin structure 220P can have a desired height in a D3 direction which will be a height of fin structures of a finFET to be obtained from the preliminary fin structure 220P in a later step. After this etching, a $1^{st}$ recess R1 between the ILD layer 208 and above the preliminary fin structure 220P is obtained.

Figure 2E:
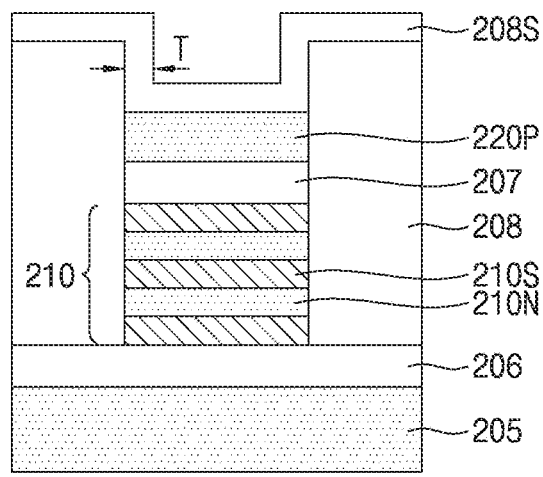

In FIG. 2E, a spacer layer 208S may be conformally layered on side and bottom surfaces of the $1^{st}$ recess R1 and top surfaces of the ILD layer 208 to have a predetermined thickness T. The spacer layer 208S may be formed of the same or similar material forming the ILD layer 208 or a material having the same or similar etch selectivity with respect to the ILD layer 208.

As the spacer layer is conformally layered on the $1^{st}$ recess, the width of the $1^{st}$ recess is therefore reduced by twice the predetermined thickness T. Here, the predetermined thickness T controls a horizontal distance between a fin structure of a finFET to be formed from the preliminary fin structure 220P and a left or right edge (or side surface) of the nanosheet layers 210N of the nanosheet stack 210 to form a nanosheet transistor, as will be described later.

Figure 2F:
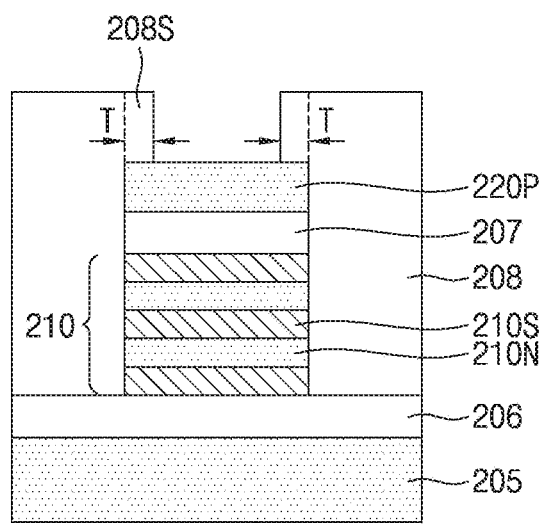

Referring FIG. 2F, the spacer layer 208S is partially etched, for example, by at least one of anisotropic etching and reactive ion etching (RIE), to leave the spacer layer 208S only on the side surfaces of the recess R1 above the left and right edge portions of the preliminary fin structure 220P so that the $1^{st}$ recess R1 is shrunk to have a smaller width than before the spacer layer 208S is deposited and etched as describe above.

The above steps of deposition and partial etching of the spacer layer 208S may be performed in one or more different ways according to embodiments. For example, the spacer layer 208s may be deposited to simply fill out the $1^{st}$ recess R1 and etched to leave the spacer layer 208S only on the side surfaces of the recess R1 above the left and right edge portions of the preliminary fin structure 220P, according to an embodiment.

Figure 2G:
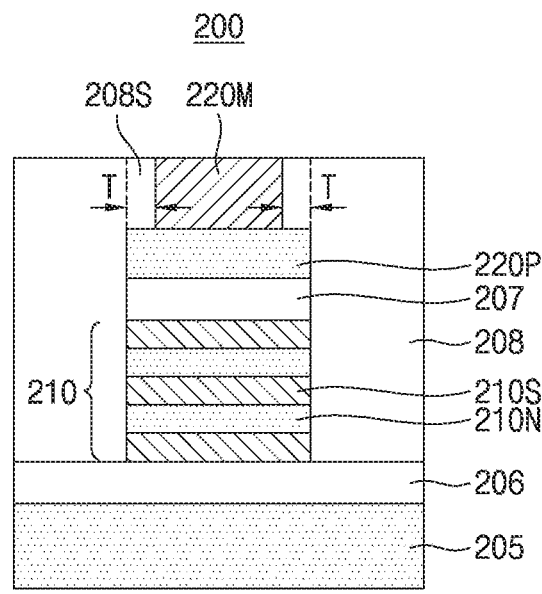

In FIG. 2G, a mask layer 220M, which may be formed of silicon nitride ($Si_xN_y$), is deposited in the $1^{st}$ recess R1 where the spacer layer 208S is deposited and etched in the previous steps. Here, the mask layer 220M may be self-aligned in the $1^{st}$ recess R1 above the preliminary fin structure 220P due to the ILD layer 208 contacting the side surfaces of the nanosheet stack 210 and the spacer layer 208S added to the ILD layer 208 to contact side surfaces of the mask layer 220M. Broadly speaking, the mask layer 220M is self-aligned with respect to the left and right side surfaces (or side edges) of the nanosheet stack 210 having a same width as the preliminary fin structure 220P. This is because side surfaces of the ILD layer 208 contacting the side surfaces of the nanosheet stack 210 and side surfaces of the spacer layer 208S exposed to the width-reduced $1^{st}$ recess are defined by the side surfaces of the nanosheet stack 210 in the previous steps.

Figure 2H:
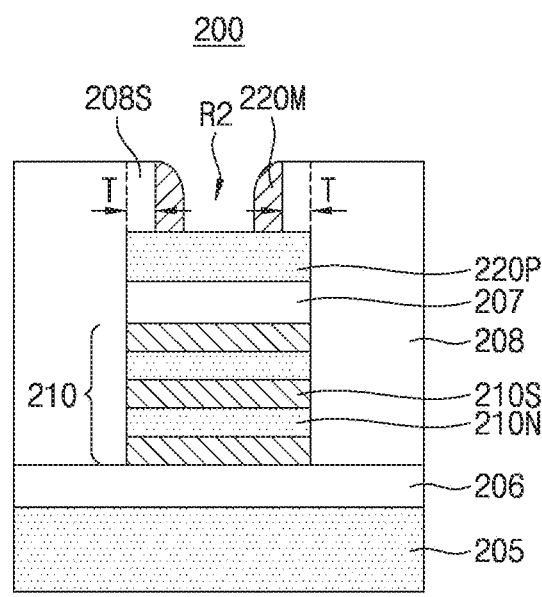

In FIG. 2H, the mask layer 220M is partially etched, for example, by anisotropic etching or reactive ion etching (RIE), not being limited thereto, in the middle to obtain a $2^{nd}$ recess R2 and two mask layers 220M corresponding to two fin structures of a finFET to be obtained above the nanosheet stack 210 in a later step.

Figure 2I:
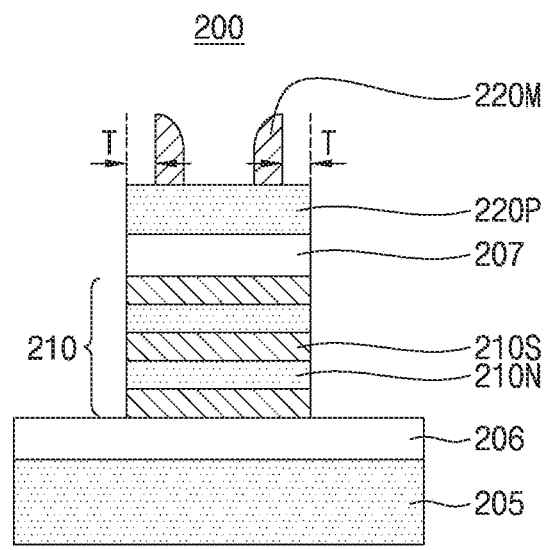

Referring to FIG. 2I, the ILD layer 208 with the spacer layer 208 is removed from the hybrid multi-stack semiconductor device 200 to leave only the partially etched mask layers 220M on the preliminary fin structure 220P. Here, the two mask layers 220M are positioned on the preliminary fin structure 220P with a same horizontal distance T from the left and right side surfaces (or side edges) of the nanosheet stack 210 which is the same as the predetermined thickness T of the spacer layer 208S shown in FIGS. 2E-2H. It is understood that the horizontal distance T is a distance horizontally measured from a virtual line vertically extended upward from the left or right side surface (side edge) of the nanosheet stack 210 and a left side surface of a left mask layer of the two mask layers 220M or a right side surface of a right mask layer of the two mask layers 220M.

Figure 2J:
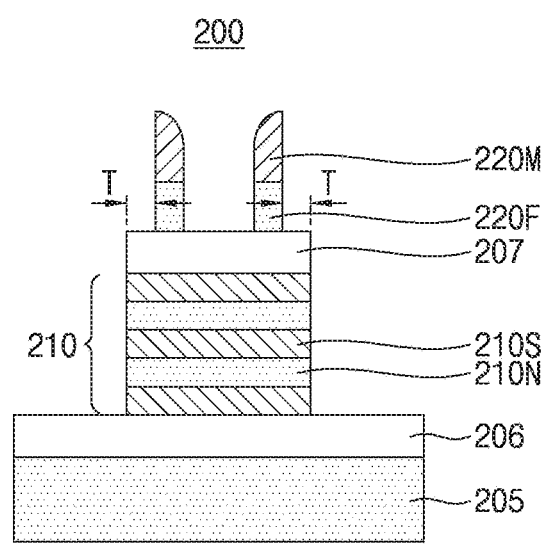

In FIG. 2J, the preliminary fin structure 220P is etched using the two mask layers 220M to obtain two fin structures 220F therebelow, corresponding to the two mask layers 220M, which also take a self-aligned form with respect to the nanosheet stack 210 because the two fin structures 220F are defined by the corresponding two mask layers which is self-aligned with respect to the side surfaces of the nanosheet stack 210 in the previous steps. Again, it is seen from FIG. 2J that the two fin structures 220F are positioned above the nanosheet stack 210 with the same horizontal distance T from the left and right side surfaces of the nanosheet stack 210 which is the same as the predetermined thickness T of the spacer layer 208S. It is understood here that the horizontal distance T may increase or decrease according to the thickness of the spacer layer 208S conformally formed on the recess R1 as shown in FIGS. 2D and 2E.

Figure 2K:
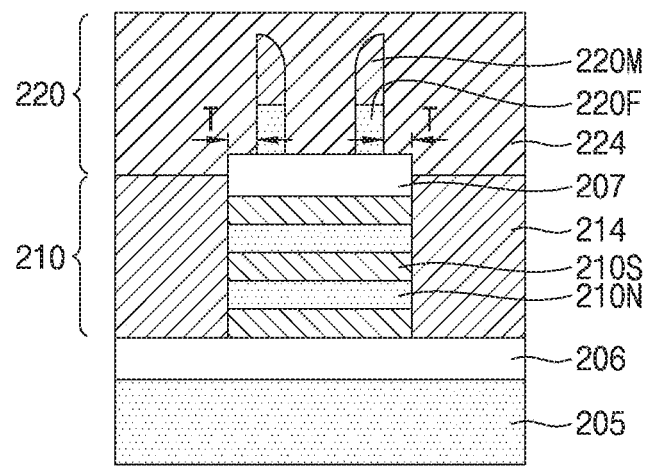

Referring to FIG. 2K, the $1^{st}$ and $2^{nd}$ dummy gate structures 214 and 224 are formed to cover the nanosheet stack 210 and the fin structures 220F shown in FIG. 2J, respectively. A material forming the $1^{st}$ dummy gate structure 214 may be, for example, amorphous silicon (a-Si) or polysilicon (poly-Si), and a material forming the $2^{nd}$ dummy gate structure 224 may be the same or different a-Si or poly-Si.

Although not shown herein, the 1$^{st}$ and 2$^{nd}$ dummy gate structures 214 and 224 may be formed as shown in FIG. 2K using another hard mask formed thereon.

Figure 2L:
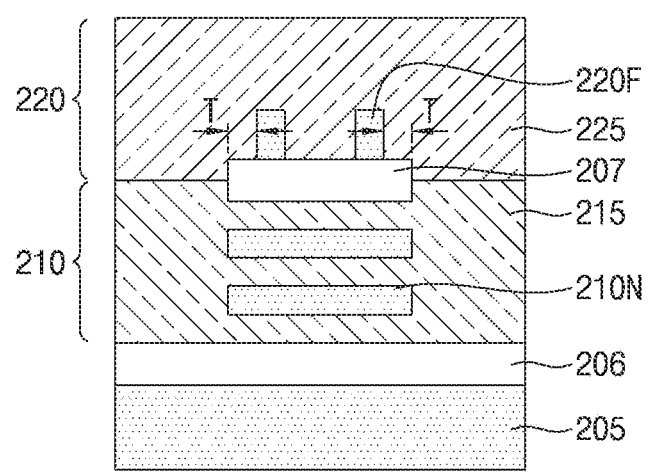

FIG. 2L shows that, after respective source/drain regions (not shown) are formed at both ends of the fin structures 220F open from the 1$^{st}$ dummy gate structure 214 and at both ends of the nanosheet layers 210N open from the 2$^{nd}$ dummy gate structure 224, the 1$^{st}$ and 2$^{nd}$ dummy gate structures 214 and 224 are removed along with the sacrificial layers 210S of the 2$^{nd}$ nanosheet stack 210, for example, by a reactive ion etching (RIE) or chemical oxide removal (COR) process, and then, replaced by 1$^{st}$ and 2$^{nd}$ gate structures 215 and 225.

The 1$^{st}$ and 2$^{nd}$ gate structure 215 and 225 may include a high-k dielectric layer of hafnium-based material, a work-function metal layer and a gate metal. The work-function metal may include one or more of titanium nitride (TiN), titanium aluminum nitride (TiAlN), titanium aluminum carbide (TiAlC), titanium carbide (TiC) and tantalum nitride (TaN), and the gate metal may include aluminum (Al) or tungsten (W). The 1$^{st}$ gate structure 215 may have a different work function material or characteristic from the 2$^{nd}$ gate structure 225, for example, when a finFET and a nanosheet transistor to be built from the 1$^{st}$ gate and 2$^{nd}$ gate structures 215 and 225 are a PMOS and an NMOS, respectively, or vice versa.

Again, the fin structures 220F are positioned above the nanosheet stack 210 with the same horizontal distance T from the left and right side surfaces of the nanosheet stack 210 to provide the hybrid multi-stack semiconductor device 200 with a finFET stack 220 having stable and balanced fin structures 220F above the nanosheet stack 210.

FIGS. 3A through 3F illustrates simplified cross-sectional views of another hybrid multi-stack semiconductor device at a plurality of steps during its manufacturing process including self-aligning of a finFET stack with respect to a nanosheet stack formed below the finFET stack, according to embodiments.

Figure 3A:
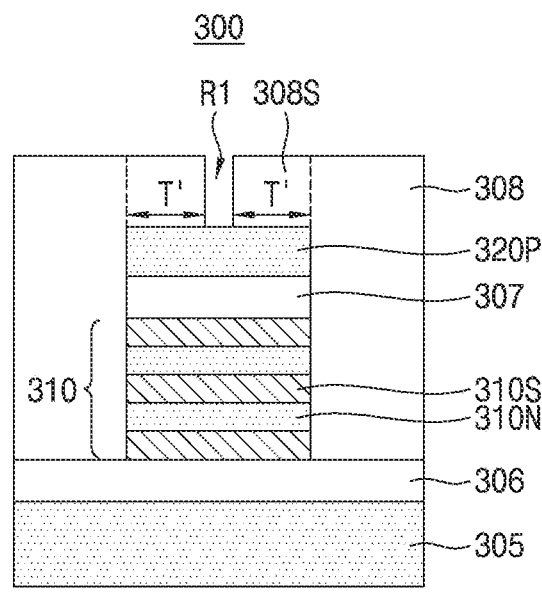
FIGS. 3A through 3F illustrates simplified cross-sectional views of another hybrid multi-stack semiconductor device at a plurality of steps during its manufacturing process including self-aligning of a finFET stack with respect to a nanosheet stack formed below the finFET stack, according to embodiments.

In FIG. 3A, a hybrid multi-stack semiconductor device 300 is provided, which is the same as the hybrid multi-stack semiconductor device 200 shown in FIG. 2F except a spacer layer 308S added to an ILD layer 308. The other elements of the hybrid multi-stack semiconductor device 300, that is, a substrate 305, an STI layer 306, a nanosheet stack 310 including three sacrificial layers 310S and two nanosheet layers 310N, an isolation layer 307, the ILD layer 308, and a preliminary fin structure 320P are the same as the corresponding elements of the hybrid multi-stack semiconductor device 200 shown in FIG. 2F. Accordingly, duplicate descriptions are omitted herein. Like in the hybrid multi-stack semiconductor device 200, the numbers of sacrificial layers and nanosheet layers are not limited to three and two in the hybrid multi-stack semiconductor device 300.

Referring to FIG. 3A, the spacer layer 308S has a predetermined thickness T' which is greater than the predetermined thickness T of the spacer layer 208S in FIG. 2F, and thus, a recess R1 formed on the preliminary fin structure 320P is narrower than the recess R1 formed on the finFET stack 220 to accommodate therein only a narrow mask layer corresponding to a single fin structure of a finFET to be formed in a later step.

It is understood here again that the predetermined thickness T' of the spacer layer 308S controls a horizontal distance between a fin structure of a finFET to be formed from the preliminary fin structure 320P and a left or right side surface (or side edge) of the nanosheet layers 310N of the nanosheet stack 310 to form a nanosheet transistor as will be described later.

Figure 3B:
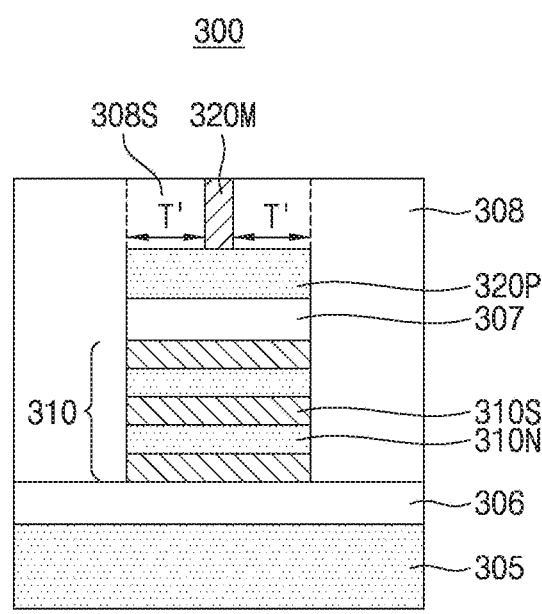

FIG. 3B shows that a mask layer 320M is deposited in the recess R1 formed in the previous step. Here, the mask layer 320M is self-aligned in the recess R1 above the preliminary fin structure 320P due to the ILD layer 308 and the spacer layer 308S which defines and contacts side surfaces of the mask layer 320M. The mask layer 320M may be viewed as self-aligned with respect to left and right side surfaces (or side edges) of the nanosheet stack 310 having a same width as the preliminary fin structure 320P.

Figure 3C:
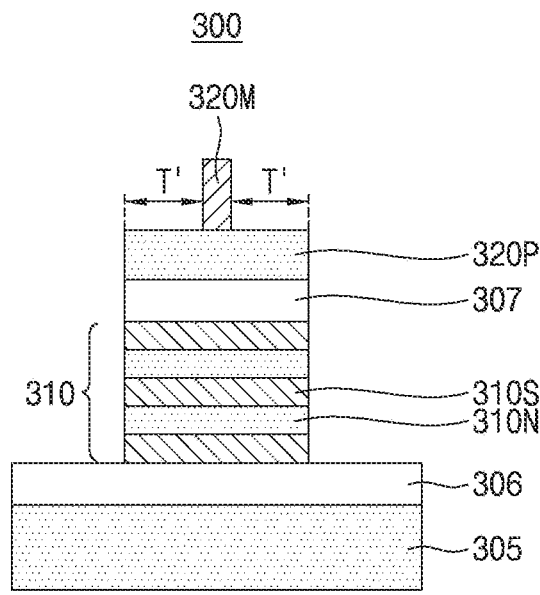

In FIG. 3C, the ILD layer 308 with the spacer layer 308S is removed from the hybrid multi-stack semiconductor device 300 to leave only the mask layer 320M at the center position on the preliminary fin structure 320P with a same horizontal distance T' from left and right side surfaces of the nanosheet stack 210 which is the same as the predetermined thickness T' of the spacer layer 308S.

Figure 3D:
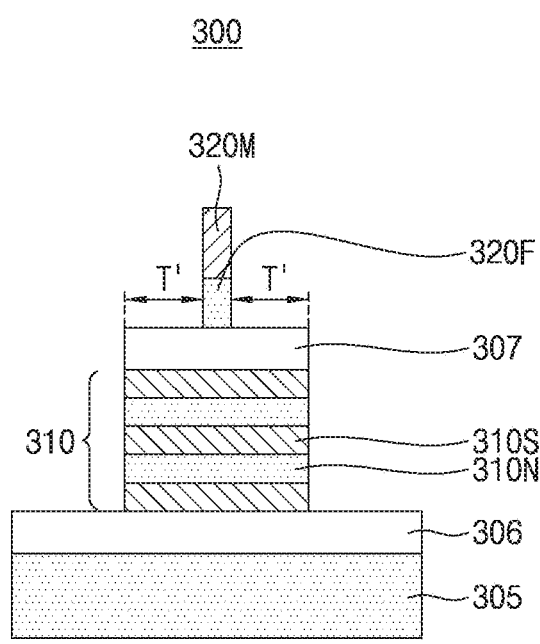

In FIG. 3D, the preliminary fin structure 320P is etched using the mask layer 320M to obtain to a single fin structure 320F corresponding to the mask layer 320M which also takes a self-aligned form with respect to the nanosheet stack 310 due to the self-aligned preliminary fin structure 320P in the previous steps. Thus, the fin structure 320F is positioned above the nanosheet stack 310 with the same horizontal distance T' from the left and right side surfaces of the nanosheet stack 310 which is the same as the predetermined thickness T' of the spacer layer 308S.

Figure 3E:
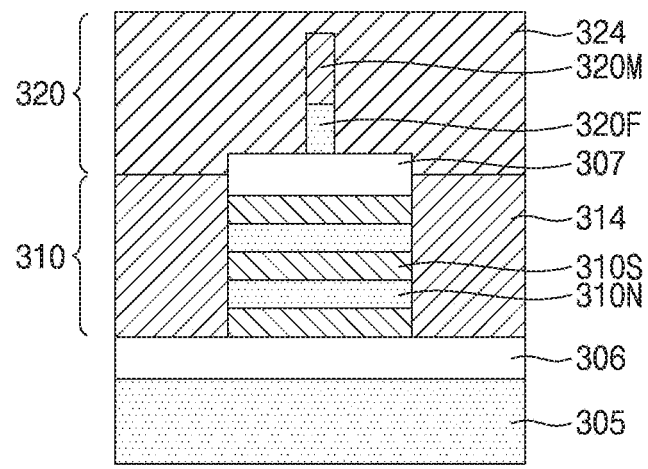

FIG. 3E shows 1$^{st}$ and 2$^{nd}$ dummy gate structures 314 and 324 are formed to cover the nanosheet stack 310 of FIG. 3D and the fin structure 320F with the mask layer 320M thereon, respectively. The same material and method forming the 1$^{st}$ and 2$^{nd}$ dummy gate structures 214 and 224 in FIG. 2K may be used to form the 1$^{st}$ and 2$^{nd}$ dummy gate structures 314 and 324.

Figure 3F:
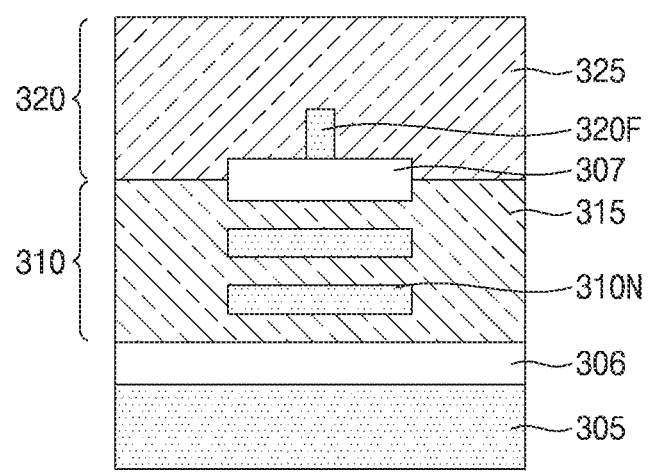

FIG. 3F shows that, after respective source/drain regions (not shown) are formed at both ends of the fin structure 320F open from the 1$^{st}$ dummy gate structure 314 and at both ends of the nanosheet layers 310N open from the 2$^{nd}$ dummy gate structure 324, the 1$^{st}$ and 2$^{nd}$ dummy gate structures 314 and 324 are removed along with the sacrificial layers 310S of the nanosheet stack 310, for example, by the same reactive ion etching (RIE) or chemical oxide removal (COR) process used to remove the 1$^{st}$ and 2$^{nd}$ dummy gate structures 214 and 224, and then, replaced by 1$^{st}$ and 2$^{nd}$ gate structures 315 and 325 which are the same as the 1$^{st}$ and 2$^{nd}$ gate structure 215 and 225 in FIG. 2L. The 1$^{st}$ and 2$^{nd}$ dummy gate structures 314 and 324 may be formed of the same materials forming the 1$^{st}$ and 2$^{nd}$ dummy gate structures 214 and 224, respectively, shown in FIG. 2L.

Again, the fin structure 320F is positioned above the nanosheet stack 310 with the same horizontal distance T from the left and right side surfaces of the nanosheet stack 310 to provide the hybrid multi-stack semiconductor device 300 with a finFET stack 320 having a stable and balanced fin structure 320F on the nanosheet stack 310.

In the above embodiments, one or two fin structures of an upper finFET stack are self-aligned with respect to a lower nanosheet stack in manufacturing a hybrid multi-stack semiconductor device. However, the number of fin structures to be self-aligned is not limited thereto, and thus, more than two fin structures may be formed in the above-described self-aligning manner with respect to a nanosheet stack formed below the fin structures to manufacture a hybrid multi-stack semiconductor device, according to embodiments.

The inventive concept is not limited to the above embodiment, and according to embodiments, a nanosheet stack formed below a finFET stack may be self-aligned with respect to the finFET stack in manufacturing a hybrid multi-stack semiconductor device, as described below.

FIGS. 4A to 4E illustrates simplified cross-sectional views of a hybrid multi-stack semiconductor device at a plurality of steps during its manufacturing process including self-aligning of a nanosheet stack with respect to a finFET stack formed above the nanosheet stack, according to embodiments.

Figure 4A:
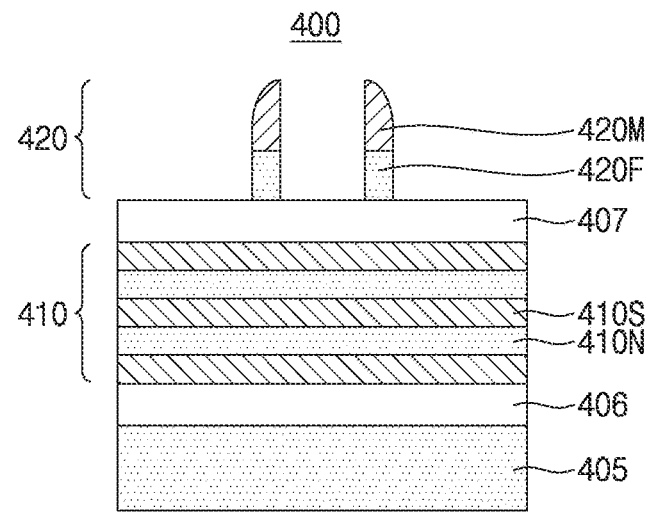
FIGS. 4A to 4E illustrates simplified cross-sectional views of a hybrid multi-stack semiconductor device at a plurality of steps during its manufacturing process including self-aligning of a nanosheet stack with respect to a finFET stack formed above the nanosheet stack, according to embodiments.

FIG. 4A provides a hybrid multi-stack semiconductor device 400 which includes a nanosheet stack 410 formed on a substrate 405 and an STI layer 406, and a finFET stack 420 formed on the nanosheet stack 410 with an isolation layer 407 therebetween. The nanosheet stack 410 includes three sacrificial layers 410S and two nanosheet layers 410N formed alternatingly above the nanosheet stack 410. The finFET stack 420 includes two fin structures 420F with two mask layers 420M respectively formed thereon as channel structures of the finFET stack 420. Materials forming the above elements of the hybrid multi-stack semiconductor device 400 may be the same as the materials forming the corresponding elements of the hybrid multi-stack semiconductor devices 200 and 300, and thus, descriptions thereabout are omitted herein. Further, the finFET stack 420 may be formed above the nanosheet stack 410 according to methods shown, or to conventional methods, and thus, descriptions thereof are also omitted herein. The numbers of the sacrificial layers 410S, the nanosheet layers 410N, the fin structures 420F and the mask layers 420M are not limited to three, two, two and two, respectively, as shown in FIG. 4A.

It is understood that when the fin structures 420F with the mask layers 420M are formed according to the conventional method which is different from the previously illustrated embodiments, they may not have been self-aligned with respect to the nanosheet stack 410 formed therebelow, and thus, a horizontal distance between a left fin structure and a left side surface of the nanosheet stack 410 may be different from a horizontal distance between a right fin structure and a right side surface of the nanosheet stack 410.

Figure 4B:
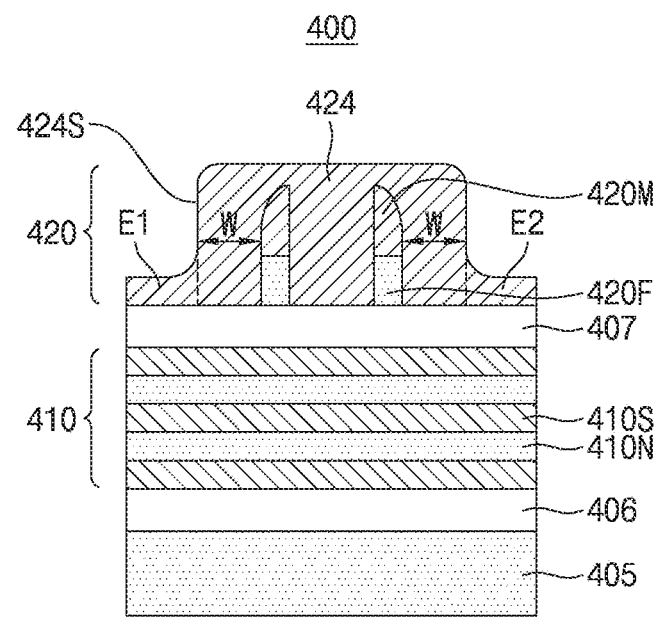

In FIG. 4B, a gate masking layer 424, which may also be referred to as a dummy gate structure or a sacrificial gate layer, is deposited on the fin structure 420F with the mask layers 420M thereon so that the finFET stack 420 now includes the gate masking layer 424, according to an embodiment. Here, the gate masking layer 424 is deposited in a self-aligning manner with respect to the fin structures 410F by using the mask layers 420M, according to an embodiment. The gate masking layer 424 may be formed of the same $Si_xN_y$ forming the mask layer 420M or a material having the same or similar etch selectivity to the material forming the mask layer 420M. The gate masking layer 424 may also be formed of poly-Si or a-Si.

Meanwhile, as the gate masking layer 424 is deposited in a self-aligning manner from top surfaces of the mask layers 420M, the gate masking layer 424 may fill out a space between the two fin structures 420F with the mask layers 420M thereon, and spread from the top and side surfaces of the mask layers 420M to be extended above the nanosheet stack 410 and the isolation layer 407 at a left side of the left fin structure and a right side of the right fin structure in outside directions. Thus, the self-aligned gate masking layer 424 includes outer-extended portions E1 and E2 which are extended from side surfaces 424S of the gate masking layer 424 and formed only above the nanosheet stack 410.

The gate masking layer 424 may be conformally deposited along the outer surfaces, that is, the top and side surfaces, of the fin structures 420F and the mask layers 420M through CVD, PECVD or ALD such that the gate masking layer 424 has a same width W, in a channel width direction, at the left side of the left fin structure and the right side of the right fin structure in the outside directions.

Figure 4C:
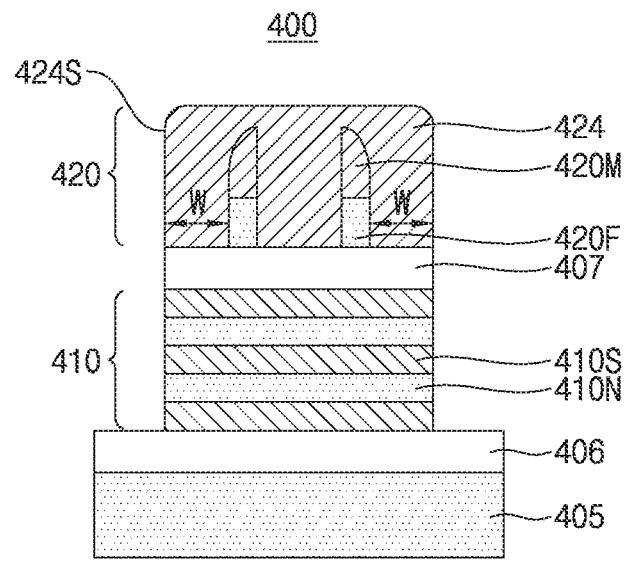

Referring to FIG. 4C, the finFET stack 420 is etched at the outer-extended portions E1 and E2 of the gate masking layer 424, and further, the isolation layer 407 and the nanosheet stack 410 below the outer-extended portions E1 and E2 are also etched through, for example, dry etching by using the gate masking layer 424 between the outer-extended portions E1 and E2 as a mask. By this etching operation, both side surfaces of the nanosheet stack 410 becomes vertically coplanar with the side surfaces 424S of the gate masking layer 424. In other words, the nanosheet stack 410, specifically, the side surfaces thereof, is self-aligned with respect to the gate masking layer 424, specifically, the side surfaces 424S thereof. Thus, unlike the previous embodiment in which a finFET stack formed above a nanosheet stack is self-aligned with respect to the nanosheet stack, the present embodiment provides a nanosheet stack self-aligned with respect to a finFET stack formed above the nanosheet stack in manufacturing a hybrid multi-stack semiconductor device. As the side surfaces of the nanosheet stack 410 are self-aligned with respect to the side surfaces 424S of the gate masking layer 424, the nanosheet stack 410 and the nanosheet layers 410N included in the nanosheet stack 410 have a same width as the gate masking layer 424.

Figure 4D:
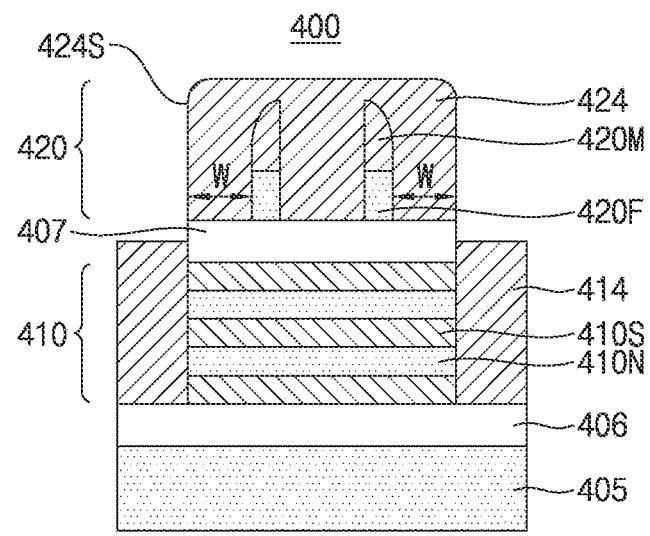

Next, as shown in FIG. 4D, a dummy gate structure 414 may be deposited to enclose the nanosheet stack 410 self-aligned in the previous steps. Now, the self-aligned nanosheet stack 410 includes the dummy gate structure 414 while the finFET stack 420 includes the self-aligned gate masking layer 424. The dummy gate structure 414 may be formed of the same material forming the dummy gate structures 214 and 314 in the previous embodiments.

Figure 4E:
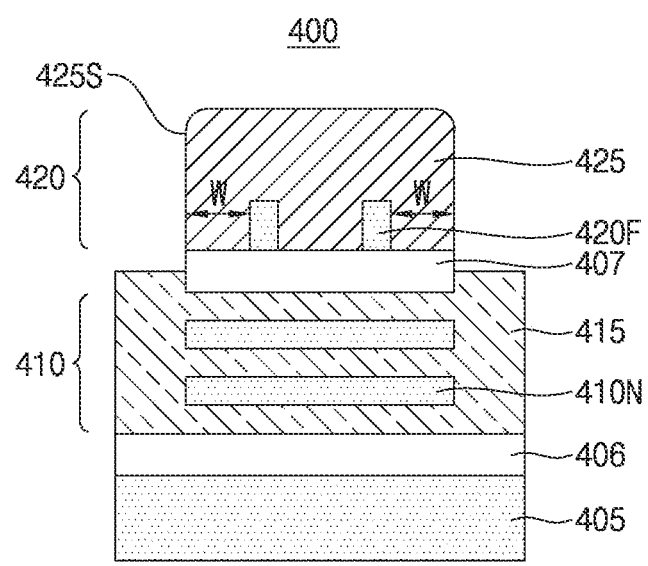

FIG. 4E shows that, after respective source/drain regions (not shown) are formed at both ends of the fin structures 420F open from the gate masking layer 424 and at both ends of the nanosheet layers 410N open from the gate masking layer 424, the gate masking layer 424 and the dummy gate structures 414 are removed along with the sacrificial layers 410S of the nanosheet stack 410, for example, by the same reactive ion etching (RIE) or chemical oxide removal (COR) process used to remove the $1^{st}$ and $2^{nd}$ dummy gate structures 214 and 224 in the previous embodiment, and then, replaced by $1^{st}$ and $2^{nd}$ gate structures 415 and 425 which are the same as the $1^{st}$ and $2^{nd}$ gate structure 215 and 225 in FIG. 2L. The $1^{st}$ and $2^{nd}$ gate structures 415 and 425 may be formed of the same materials forming the $1^{st}$ and $2^{nd}$ gate structures 215 and 225, respectively, shown in FIG. 2L.

Referring to FIG. 4E, the nanosheet stack 410, specifically, side surfaces of the nanosheet layers 410N, is self-aligned with respect to the side surfaces 425S of the $2^{nd}$ gate structure 425 such that the nanosheet layers 410N have a same width as the 2nd gate structure 425. This is because the side surfaces of the nanosheet stack 410 shown in FIG. 4C are self-aligned with respect to the side surfaces 424S of the gate masking layer 424 which corresponds to and defines the $2^{nd}$ gate structure 425, and then, the $1^{st}$ gate structure 415 is deposited to enclose the nanosheet stack 410 shown in FIG. 4C. Meanwhile, the nanosheet stack 410 of FIG. 4E may be said to be self-aligned with respect to the fin structures 420F. This is because the gate masking layer 424, which defines the $2^{nd}$ gate structure 425, is self-aligned with respect to the fin structures 420F in the earlier step described in reference to FIG. 4B. Moreover, the $2^{nd}$ gate structure 425 may be said to be self-aligned with respect to fin structures 420F because the $2^{nd}$ gate structure 425 corresponds to and is defined by the gate masking layer 424 which is self-aligned with respect to the fin structures 420F as described in reference to FIG. 4B.

In the present embodiment, the number of the fin structures 420F included in the finFET stack 420 is two. However, one fin structure or more than two fin structures of the finFET stack 420 may be formed above the nanosheet stack 410 to self-align the nanosheet stack 410 with respect to the finFET stack 420, according to an embodiment.

Moreover, it is understood that the width of the nanosheet layers 410N in the channel width direction is determined based on the number of the fin structures 420F formed above the nanosheet stack 410. Thus, when more than two fin structures are formed above the nanosheet stack 410, the width of the nanosheet layers 410N increases. The width of nanosheet layers 410N may also be determined based on a pitch between the two fin structures 420F. Thus, when the pitch increases, the width of the nanosheet layers 410N may increases proportionally.

The present embodiment provides that, unlike the previous embodiment of self-aligning the finFET stacks 220 and 320 with respect to the nanosheet stacks 210 and 310, respectively, the nanosheet stack 410 is self-aligned with respect to the finFET stack 420, specifically, with respect to the gate masking layer 424, which is also self-aligned with respect to its fin structures 420F, in manufacturing the hybrid multi-stack semiconductor device 400. The hybrid multi-stack semiconductor device 400 of the present embodiment may also differ from the hybrid multi-stack semiconductor device 200 of the previous embodiment in that the $1^{st}$ gate structure 415 has a greater width than the $2^{nd}$ gate structure 425, and thus, the nanosheet stack 410 including the $1^{st}$ gate structure 415 has a greater width than the finFET stack 420 including the $2^{nd}$ gate structure 425. This is at least because the $2^{nd}$ dummy gate structure 414 and the $2^{nd}$ gate structure 425 are formed to enclose the nanosheet stack 410 which are self-aligned with respect to the side surfaces of the gate masking layer 424.

Due the above self-alignment of the nanosheet stack 410 with respect to the fin structure 420, the width of the nanosheet layers 410 may be controlled by the dimensions of the fin structures 420F of the finFET stack 420 such as the number of the fin structures 420F and/or the pitch between the fin structures 420F, and further, the hybrid multi-stack semiconductor device 400 may have stable and balanced fin structures 420F above the nanosheet stack 410.

Figure 5:
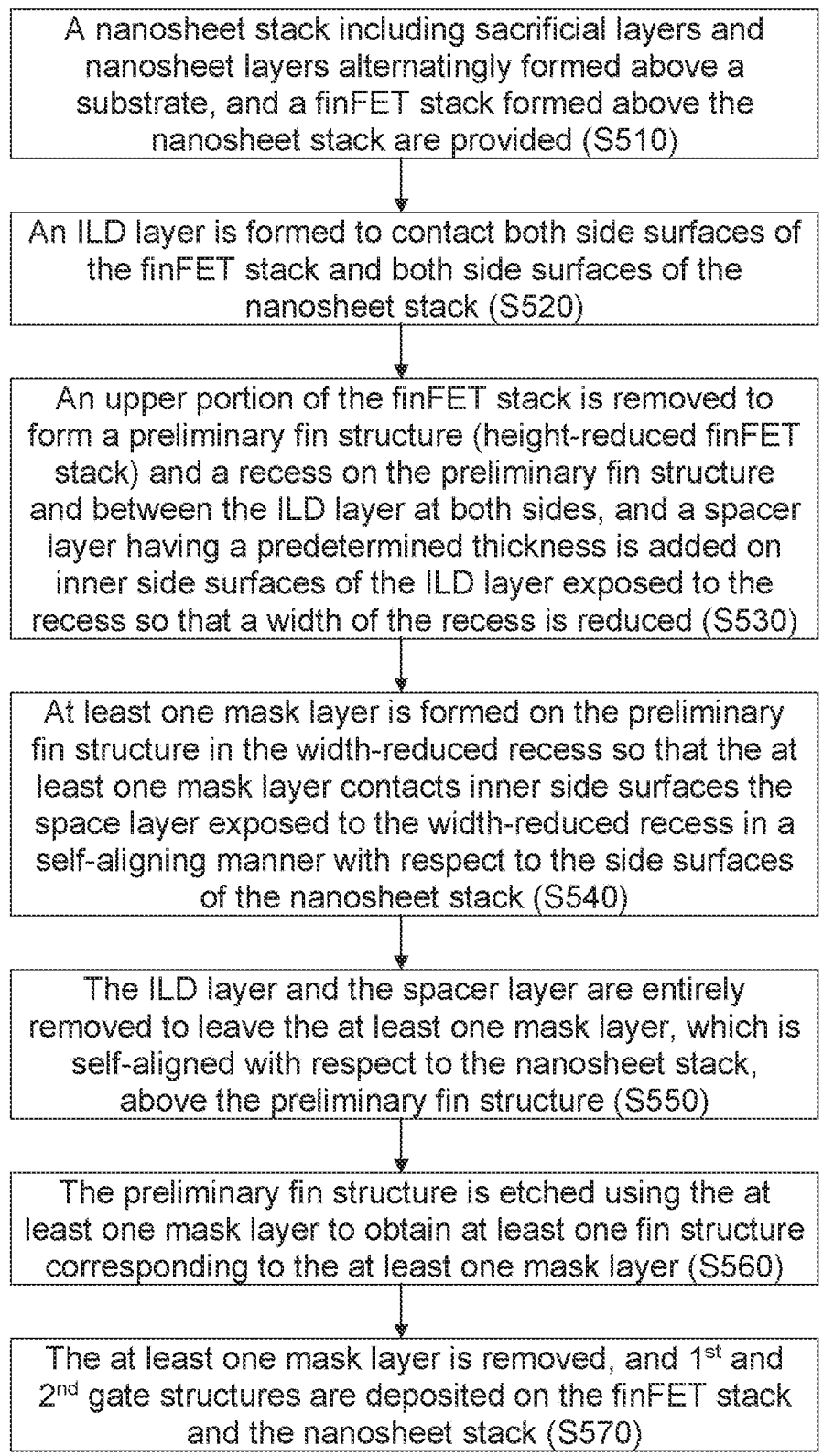
FIG. 5 illustrates a flowchart of a method of manufacturing a hybrid multi-stack semiconductor device in reference to FIGS. 2A to 2L through FIGS. 3A to 3F, according to embodiments.

FIG. 5 illustrates a flowchart of a method of manufacturing a hybrid multi-stack semiconductor device in reference to FIGS. 2A to 2L through FIGS. 3A to 3F, according to embodiments.

In operation S510, a nanosheet stack including a plurality of sacrificial layers and nanosheet layers alternatingly formed above a substrate is provided, and a finFET stack is formed above the nanosheet stack so that both side surfaces of the finFET stack are vertically coplanar with both side surfaces of the nanosheet stack, as shown in FIGS. 2A and 2B.

In operation S520, an ILD layer is formed to contact the both side surfaces of the finFET stack and the both side surfaces of the nanosheet stack, thereby isolating the nanosheet stack and the finFET stack from an adjacent semiconductor device, as shown in FIG. 2C.

In operation S530, an upper portion of the finFET stack is removed to form a preliminary fin structure, which is a height-reduced finFET stack, and a recess on the preliminary fin structure and between the ILD layer at both sides, and a spacer layer having a predetermined thickness is added on inner side surfaces of the ILD layer exposed to the recess so that a width of the recess is reduced, as shown in FIGS. 2D to 2F. The spacer layer may be formed of the same or similar material of the ILD layer, and thus, may be referred to as a supplemental ILD layer. As the spacer layer is added on the inner side surfaces of the ILD layer, the width of the recess is reduced by the thickness of the spacer layer at both sides of the recess. The spacer layer may be formed in a number of different ways. According to an embodiment, the spacer layer may be first deposited on side and bottom surfaces of the recess and top surfaces of the ILD layer, and then, anisotropic etching and/or reactive ion etching (RIE) may be performed to leave the spacer layer only on the side surfaces of the recess above edge portions of the preliminary fin structure so that the recess is shrunk to have a smaller width than before.

In operation S540, at least one mask layer is formed on the preliminary fin structure in the width-reduced recess so that the at least one mask layer contacts inner side surfaces the spacer layer exposed to the width-reduced recess in a self-aligning manner with respect to the side surfaces of the nanosheet stack which define side surfaces the ILD layer contacting the side surfaces of the nanosheet stack and the inner side surfaces of the spacer layer, as shown in FIGS. 2G and 2H. Here, the number of at least one mask layer may be one when only a single fin structure is to be formed to build a finFET in a later step. However, the number of the at least one mask layer may be two or more mask layers when two or more fin structures are to be formed to build the finFET in the later step.

After forming the at least one mask layer, the ILD layer and the spacer layer are removed to leave the at least one mask layer, which is self-aligned with respect to the nanosheet stack, above the preliminary fin structure, as shown in FIG. 2I (S550). Thus, a left horizontal distance between a left-most mask layer among the at least one mask layer and a left side surface of the nanosheet stack is equal to a right horizontal distance between a right-most mask layer among the at least one mask layer and a right side surface of the nanosheet stack.

In operation S560, the preliminary fin structure is etched using the at least one mask layer to obtain at least one fin structure corresponding to the at least one mask layer, as shown in FIG. 2J. Here, the at least one fin structure is also self-aligned with respect to the nanosheet stack because the at least one fin structure is defined by the corresponding at least one mask layer which is self-aligned with respect to the side surfaces of the nanosheet stack in the previous step.

In operation S570, the at least one mask layer is removed, and $1^{st}$ and $2^{nd}$ gate structures are deposited on the finFET stack and the nanosheet stack, respectively, as shown in FIGS. 2K and 2L. Before the at least one mask layer is removed, $1^{st}$ and $2^{nd}$ dummy gate structures may be deposited on the finFET stack and the nanosheet stack, respectively, and source/drain regions may be formed on the finFET stack and the nanosheet stack. Subsequently, the $1^{st}$ and $2^{nd}$ dummy gate structures and the at least one mask layer may be removed along with the sacrificial layers to be replaced by the $1^{st}$ and $2^{nd}$ gate structures.

Through the above process, a finFET stack is self-aligned with respect to a nanosheet stack formed below the finFET stack in manufacturing a hybrid multi-stack semiconductor device.

Figure 6:
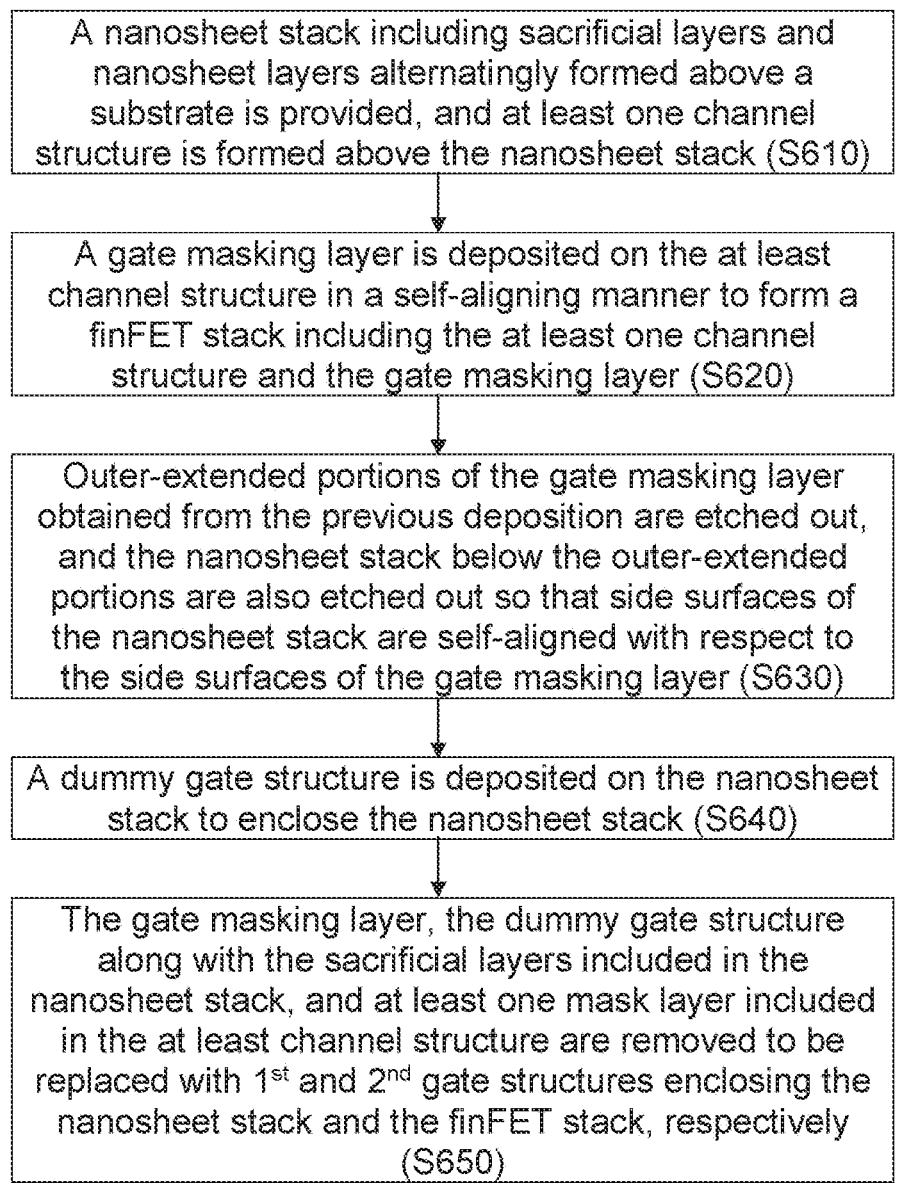
FIG. 6 illustrates a flowchart of a method of manufacturing a hybrid multi-stack semiconductor device in reference to FIGS. 4A to 4E, according to embodiments.

FIG. 6 illustrates a flowchart of a method of manufacturing a hybrid multi-stack semiconductor device in reference to FIGS. 4A to 4E, according to embodiments.

In operation S610, a nanosheet stack including a plurality of sacrificial layers and nanosheet layers alternatingly formed above a substrate is provided, and at least one channel structure is formed above the nanosheet stack, as shown in FIG. 4A. The at least one channel structure may be formed of at least one fin structure and at least one mask layer respectively formed thereon.

In operation S620, a gate masking layer is deposited on the at least channel structure in a self-aligning manner to form a finFET stack including the at least one channel structure and the gate masking layer, as shown in FIG. 4B. Here, the gate masking layer is deposited on top and side surfaces of the at least one channel structure and spread outward above the nanosheet stack to form outer-extended portions of the gate masking layer. By this self-aligning deposition of the gate masking layer on the at least one channel structure, the gate masking layer at both sides of the at least one channel structure has a same width in a channel width direction.

In operation S630, the outer-extended portions of the gate masking layer are etched out, and the nanosheet stack at both sides thereof below the outer-extended portions are also etched out so that side surfaces of the nanosheet stack are self-aligned with respect to the side surfaces of the gate masking layer, as shown in FIG. 4C. Due to the above etching steps, the side surfaces of the gate masking layer and the side surfaces of the nanosheet stack become coplanar with each other.

In operation S640, a dummy gate structure is deposited on the nanosheet stack to enclose the nanosheet stack, as shown in FIG. 4D, and in operation S650, the gate masking layer, the dummy gate structure along with the sacrificial layers included in the nanosheet stack, and the at least one mask layer included in the at least channel structure are removed to be replaced with $1^{st}$ and $2^{nd}$ gate structures enclosing the nanosheet stack and the finFET stack, respectively, as shown in FIG. 4E.

Through the above process, a nanosheet stack is self-aligned with respect to a finFET stack formed above the nanosheet stack in manufacturing a hybrid multi-stack semiconductor device. Further, the width of the nanosheet layers in the channel width direction may be controlled by at least one of the number of the at least one channel structure included in the finFET stack or a pitch between two or more channel structures when the at least one channel structure includes two or more fin structures.

Figure 7:
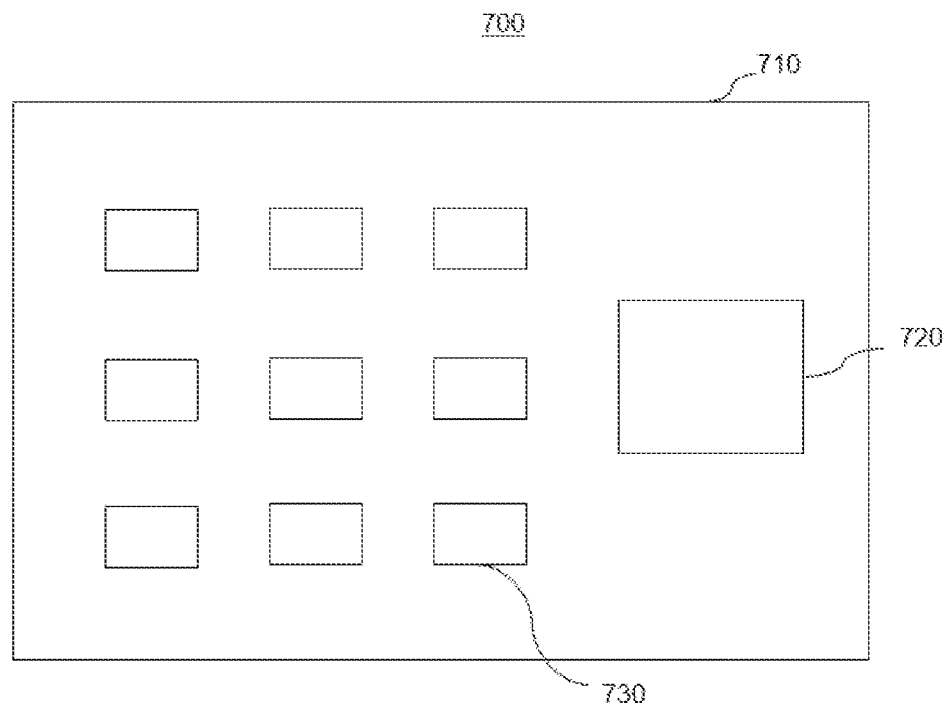
FIG. 7 illustrates a schematic plan view of a semiconductor module according to an embodiment.

FIG. 7 illustrates a schematic plan view of a semiconductor module according to an embodiment.

Referring to FIG. 7, a semiconductor module 700 according to an embodiment may include a processor 720 and semiconductor devices 730 that are mounted on a module substrate 710. The processor 720 and/or the semiconductor devices 730 may include one or more hybrid multi-stack semiconductor devices described in the above embodiments.

Figure 8:
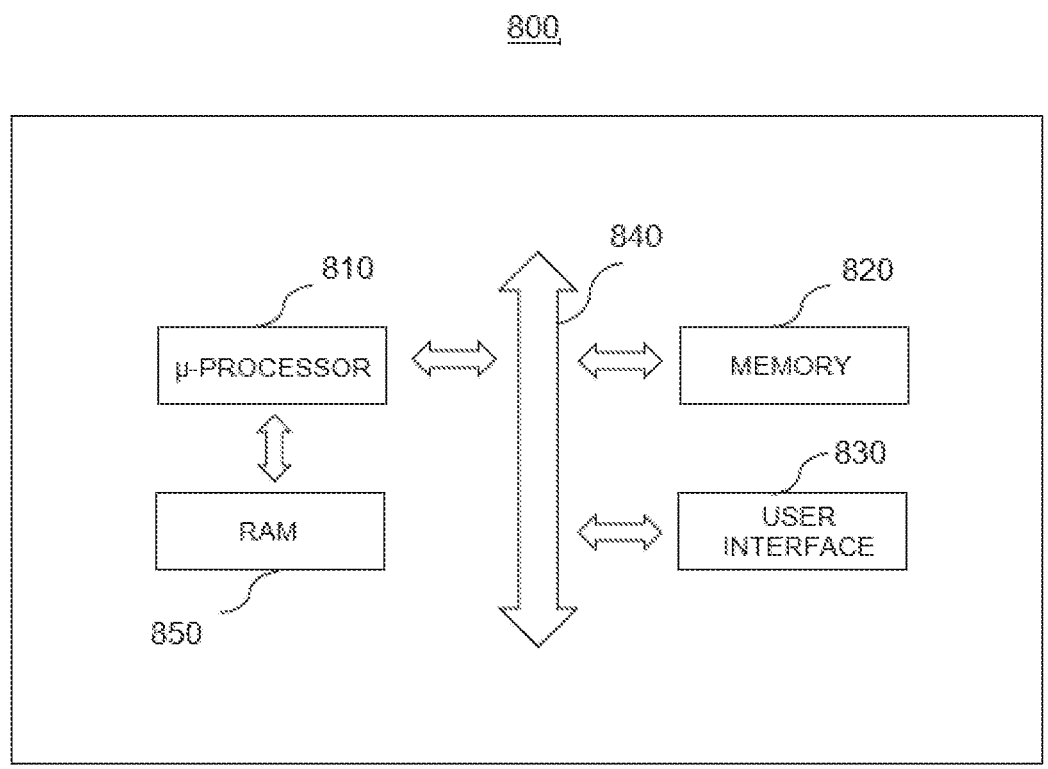
FIG. 8 illustrates a schematic block diagram of an electronic system according to an embodiment.

FIG. 8 illustrates a schematic block diagram of an electronic system according to an embodiment.

Referring to FIG. 8, an electronic system 800 in accordance with an embodiment may include a microprocessor 810, a memory 820, and a user interface 830 that perform data communication using a bus 840. The microprocessor 810 may include a central processing unit (CPU) or an application processor (AP). The electronic system 800 may further include a random access memory (RAM) 850 in direct communication with the microprocessor 810. The microprocessor 810 and/or the RAM 850 may be implemented in a single module or package. The user interface 830 may be used to input data to the electronic system 800, or output data from the electronic system 800. For example, the user interface 830 may include a keyboard, a touch pad, a touch screen, a mouse, a scanner, a voice detector, a liquid crystal display (LCD), a micro light-emitting device (LED), an organic light-emitting diode (OLED) device, an active-matrix light-emitting diode (AMOLED) device, a printer, a lighting, or various other input/output devices without limitation. The memory 820 may store operational codes of the microprocessor 810, data processed by the microprocessor 810, or data received from an external device. The memory 820 may include a memory controller, a hard disk, or a solid state drive (SSD).

At least the microprocessor 810, the memory 820 and/or the RAM 850 in the electronic system 800 may include one or more hybrid multi-stack semiconductor devices described in the above embodiments.

The above embodiment may enable to manufacture hybrid multi-stack semiconductor devices having stable and balanced fin structures of a finFET stack formed above a nanosheet stack, and further, nanosheet layers of the nanosheet stack of which a width is controlled by the dimensions of the fin structures of the finFET stack such as the number of the fin structures and/or the pitch between the fin structures.

The foregoing is illustrative of exemplary embodiments and is not to be construed as limiting thereof. For example, one or more steps described above for manufacturing a supervia may be omitted to simplify the process. Although a few exemplary embodiments have been described, those skilled in the art will readily appreciate that many modifications are possible in the above embodiments without materially departing from the inventive concept.

What is claimed is:

1. A hybrid multi-stack semiconductor device comprising a nanosheet stack and a fin field-effect transistor (finFET) stack formed above the nanosheet stack,
   wherein the nanosheet stack comprises a plurality of nanosheet layers formed above a substrate and enclosed by a $1^{st}$ gate structure,
   wherein the finFET stack comprises at least one fin structure enclosed by a $2^{nd}$ gate structure, and
   wherein a left horizontal distance between a leftmost side surface of the at least one fin structure and a left side surface of the nanosheet stack is equal to a right horizontal distance between a rightmost side surface of the at least one fin structure and a right side surface of the nanosheet stack.

2. The hybrid multi-stack semiconductor device of claim 1, wherein the at least one fin structure comprises two or more fin structures, and
   wherein the left horizontal distance, which is between a leftmost fin structure among the two or more fin structures and the left side surface of the nanosheet stack, is equal to the right horizontal distance which is between a rightmost fin structure among the two or more fin structures and the right side surface of the nanosheet stack.

3. The hybrid multi-stack semiconductor device of claim 2, wherein the two or more fin structures have a self-aligned form with respect to the left and right side surfaces of the nanosheet stack.

4. The hybrid multi-stack semiconductor device of claim 1, wherein the at least one fin structure has the self-aligned form with respect to the left and right side surfaces of the nanosheet stack.

5. A hybrid multi-stack semiconductor device comprising a nanosheet stack and a fin field-effect transistor (finFET) stack formed above the nanosheet stack,
  wherein the nanosheet stack comprises a plurality of nanosheet layers formed above a substrate and enclosed by a $1^{st}$ gate structure,
  wherein the finFET stack comprises at least one fin structure enclosed by a $2^{nd}$ gate structure, and
  wherein the plurality of nanosheet layers have a same width as the $2^{nd}$ gate structure in a channel width direction.

6. The hybrid multi-stack semiconductor device of claim 5, wherein the nanosheet stack has a self-aligned form with respect to the $2^{nd}$ gate structure.

7. The hybrid multi-stack semiconductor device of claim 5, wherein a width of the nanosheet stack or the nanosheet layers is proportional to at least one of a number of the at least one fin structure enclosed by the $2^{nd}$ gate structure or a pitch between two or more fin structures when the at least one fin structure comprises the two or more fin structures.

8. The hybrid multi-stack semiconductor device of claim 5, wherein so that the plurality of nanosheet layers have the same width as the 2nd gate structure.

9. The hybrid multi-stack semiconductor device of claim 8, wherein the nanosheet stack or the nanosheet layers have a self-aligned form with respect to the $2^{nd}$ gate structure or the at least one fin structure.

10. The hybrid multi-stack semiconductor device of claim 9, wherein the nanosheet stack has a greater width than the $2^{nd}$ gate structure.

11. The hybrid multi-stack semiconductor device of claim 8, wherein the $2^{nd}$ gate structure has a self-aligned form with respect to the at least one fin structure.

12. The hybrid multi-stack semiconductor device of claim 5, wherein the nanosheet stack has a greater width than the $2^{nd}$ gate structure.

13. A method of manufacturing a hybrid multi-stack semiconductor device, the method comprising:
  providing a nanosheet stack comprising a plurality of sacrificial layers and nanosheet layers alternately formed above a substrate;
  forming at least one channel structure above the nanosheet stack;
  depositing a gate masking layer on the at least channel structure to form a fin field-effect transistor (finFET) stack such that the gate masking layer is formed on top and side surfaces of the at least one channel structure and spread outward above the nanosheet stack to form outer-extended portions of the gate masking layer, wherein the gate masking layer at both sides of the at least one channel structure has a same width in a channel width direction;
  removing the outer-extended portions of the gate masking layer; and
  etching the nanosheet stack below the outer-extended portions of the gate masking layers so that side surfaces of the nanosheet stack are coplanar with side surfaces of the finFET stack.

14. The method of claim 13, wherein the side surfaces of the nanosheet stack are self-aligned with respect to side surfaces of the gate masking layer included in the finFET stack.

15. The method of claim 13, wherein side surfaces of the nanosheet layers are self-aligned with respect to the gate masking layer included in the finFET stack.

16. The method of claim 15, wherein the gate masking layer is self-aligned with respect to the at least one channel structure of the finFET stack.

17. The method of claim 13, wherein a width of the nanosheet layers in the channel width direction is determined at least one of a number of the at least one channel structure formed above the nanosheet stack, and a pitch between two or more fin structures when the at least one channel structure comprises the two or more fin structures.

18. The method of claim 13, wherein the at least one channel structure comprises two or more channel structures each of which comprises a fin structure and a mask layer formed on the fin structure, and
  wherein a left horizontal distance between a left-most channel structure among the two or more channel structures and a left side surface of the nanosheet stack is equal to a right horizontal distance between a right-most channel structure among the two or more channel structures and a right side surface of the nanosheet stack.

19. The method of claim 13, wherein the at least one channel structure comprises two or more channel structures, and
  wherein, before the forming the at least one channel structure above the nanosheet stack, a left horizontal distance between a left-most channel structure among the two or more channel structures and a left side surface of the nanosheet stack is not equal to a right horizontal distance between a right-most channel structure among the two or more channel structures and a right side surface of the nanosheet stack.

20. The method of claim 13, further comprising:
depositing a dummy gate structure on the nanosheet stack; and
depositing $1^{st}$ and $2^{nd}$ gate structures on the finFET stack and the nanosheet stack, respectively.

* * * * *